United States Patent
Yang et al.

(10) Patent No.: US 11,121,314 B2
(45) Date of Patent: *Sep. 14, 2021

(54) LARGE HEIGHT TREE-LIKE SUB 30NM VIAS TO REDUCE CONDUCTIVE MATERIAL RE-DEPOSITION FOR SUB 60NM MRAM DEVICES

(71) Applicant: Taiwan Semiconductor Manufacturing Company, Ltd., Hsin-Chu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/927,461

(22) Filed: Jul. 13, 2020

(65) Prior Publication Data
US 2020/0343443 A1 Oct. 29, 2020

Related U.S. Application Data

(63) Continuation of application No. 16/113,088, filed on Aug. 27, 2018, now Pat. No. 10,714,680.

(51) Int. Cl.
*H01L 43/12* (2006.01)
*H01F 10/32* (2006.01)
*H01F 41/34* (2006.01)
*H01L 43/02* (2006.01)
(Continued)

(52) U.S. Cl.
CPC ......... *H01L 43/12* (2013.01); *H01F 10/3254* (2013.01); *H01F 41/34* (2013.01);
(Continued)

(58) Field of Classification Search
CPC ............. H01L 21/02063; H01L 21/486; H01L 21/76877; H01L 23/481; H01L 23/49833;
(Continued)

(56) References Cited

U.S. PATENT DOCUMENTS

| 8,324,698 B2 | 12/2012 | Zhong et al. |
| 1,041,854 A1 | 9/2019 | Yang et al. |

(Continued)

FOREIGN PATENT DOCUMENTS

| JP | 2016513868 | 5/2016 |
| KR | 20160138387 A | 12/2016 |

(Continued)

*Primary Examiner* — David C Spalla
(74) *Attorney, Agent, or Firm* — Haynes and Boone, LLP

(57) ABSTRACT

A stack of connecting metal vias is formed on a bottom electrode by repeating steps of depositing a conductive via layer, patterning and trimming the conductive via layer to form a sub 30 nm conductive via, encapsulating the conductive via with a dielectric layer, and exposing a top surface of the conductive via. A MTJ stack is deposited on the encapsulated via stack. A top electrode layer is deposited on the MTJ stack and patterned and trimmed to form a sub 60 nm hard mask. The MTJ stack is etched using the hard mask to form an MTJ device and over etched into the encapsulation layers but not into the bottom electrode wherein metal re-deposition material is formed on sidewalls of the encapsulation layers underlying the MTJ device and not on sidewalls of a barrier layer of the MTJ device.

20 Claims, 2 Drawing Sheets

(51) Int. Cl.
*G11C 11/16* (2006.01)
*H01L 27/22* (2006.01)

(52) U.S. Cl.
CPC ............ *H01L 43/02* (2013.01); *G11C 11/161* (2013.01); *H01L 27/222* (2013.01)

(58) Field of Classification Search
CPC . H01L 23/5226; H01L 23/528; H01L 27/222; H01L 27/228; H01L 43/02; H01L 43/08; H01L 43/12
See application file for complete search history.

(56) References Cited

U.S. PATENT DOCUMENTS

| | | | |
|---|---|---|---|
| 10,714,680 B2* | 7/2020 | Yang | ................. H01L 43/10 |
| 2009/0261313 A1 | 10/2009 | Lung et al. | |
| 2014/0284737 A1 | 9/2014 | Kumura | |
| 2017/0104152 A1 | 4/2017 | Bae et al. | |
| 2017/0125668 A1* | 5/2017 | Paranjpe | ................. H01L 43/08 |
| 2018/0040668 A1* | 2/2018 | Park | ................. G11C 11/161 |
| 2019/0312197 A1* | 10/2019 | Yang | ................. G11C 11/161 |
| 2020/0066973 A1 | 2/2020 | Yang et al. | |

FOREIGN PATENT DOCUMENTS

| | | |
|---|---|---|
| TW | 201503438 A | 1/2015 |
| TW | 201543727 A | 11/2015 |
| TW | 201735411 A | 10/2017 |
| WO | 2014148587 A1 | 9/2014 |
| WO | 2015147855 A1 | 10/2015 |

* cited by examiner

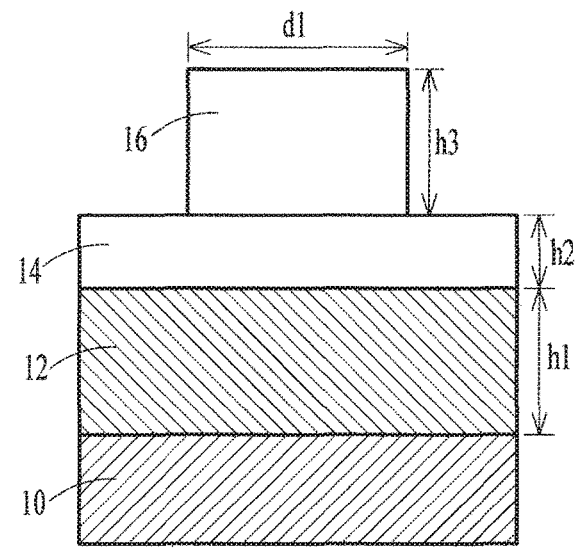
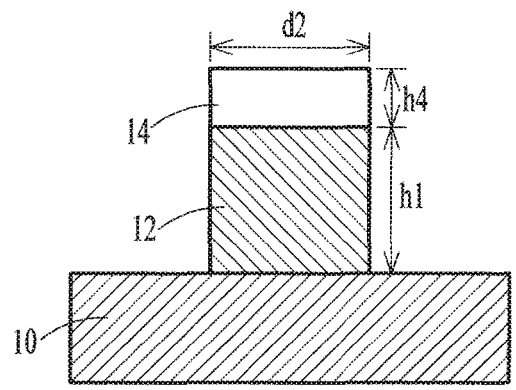
Figure 1
Figure 2
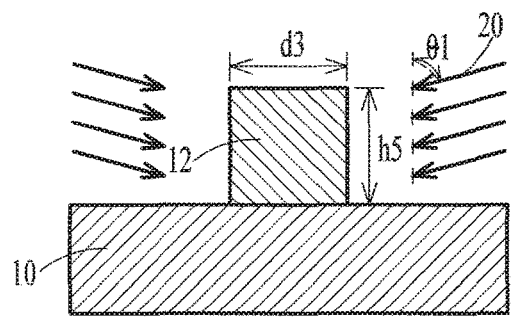
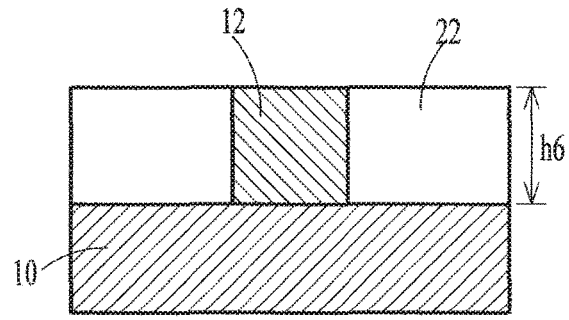
Figure 3
Figure 4

LARGE HEIGHT TREE-LIKE SUB 30NM VIAS TO REDUCE CONDUCTIVE MATERIAL RE-DEPOSITION FOR SUB 60NM MRAM DEVICES

PRIORITY DATA

This application is a continuation of U.S. patent application Ser. No. 16/113,088, filed Aug. 27, 2018, which is incorporated herein by reference in its entirety.

RELATED PATENT APPLICATION

This application is related to co-pending U.S. patent application Ser. No. 16/133,955 filed on Sep. 18, 2018, assigned to the same assignee as the present application and herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance. To solve this issue, pure physical etching techniques such as pure Ar RIE or ion beam etching (IBE) have been applied to etch the MTJ stack.

However, due to the non-volatile nature, pure physically etched conductive materials in the MTJ and bottom electrode can form a continuous path across the tunnel barrier, resulting in shorted devices. One solution to this is to form dielectric surrounded vias smaller than the MTJ connecting the MTJ and bottom electrode. This allows for a great over etch of the MTJ so that the metal re-deposition from the MTJ itself can be limited below the tunnel barrier; meanwhile, re-deposition from the bottom electrode is completely avoided. However, the via height, which represents the spacing between the MTJ and bottom electrode, is usually <50 nm, limited by the poor etch selectivity between the photoresist and via material. A new approach to further increase the via height is required if a greater MTJ over etch is needed to further reduce the metal re-deposition.

Several references teach over etching to form MTJ's, including U.S. Patent Applications 2018/0040668 (Park et al) and 2017/0125668 (Paranipe et al). Other references teach thin vias on wider metal layers, such as U.S. Pat. No. 8,324,698 (Zhong et al). All of these references are different from the present disclosure.

SUMMARY

It is an object of the present disclosure to provide an improved method of forming MTJ structures.

Yet another object of the present disclosure is to provide a method of forming MTJ devices using a physical over etch to avoid both chemical damage and physical shorts.

A further object of the present disclosure is to provide a method of forming MTJ devices using a physical over etch into a dielectric layer encapsulating stacked metal vias on a bottom electrode to avoid both chemical damage and physical shorts.

In accordance with the objectives of the present disclosure, a method for etching a magnetic tunneling junction (MTJ) structure is achieved. A stack of connecting metal vias is formed on a bottom electrode by repeating steps of depositing a conductive via layer, patterning and trimming the conductive via layer to form a sub 30 nm conductive via, encapsulating the conductive via with a dielectric layer, and exposing a top surface of the conductive via to form a stack of connecting metal vias. A MTJ stack is deposited on the encapsulated via stack wherein the MTJ stack comprises at least a pinned layer, a barrier layer on the pinned layer, and a free layer on the barrier layer. A top electrode layer is deposited on the MTJ stack and patterned and trimmed to form a sub 60 nm hard mask. The MTJ stack is etched using the hard mask to form an MTJ device and over etched into the encapsulation layers but not into the bottom electrode wherein metal re-deposition material is formed on sidewalls of the encapsulation layers underlying the MTJ device and not on sidewalls of a barrier layer of the MTJ device.

BRIEF DESCRIPTION OF THE DRAWINGS

In the accompanying drawings forming a material part of this description, there is shown:

FIGS. 1 through 7 illustrate in cross-sectional representation steps in a preferred embodiment of the present disclosure.

DETAILED DESCRIPTION

Figure 5:
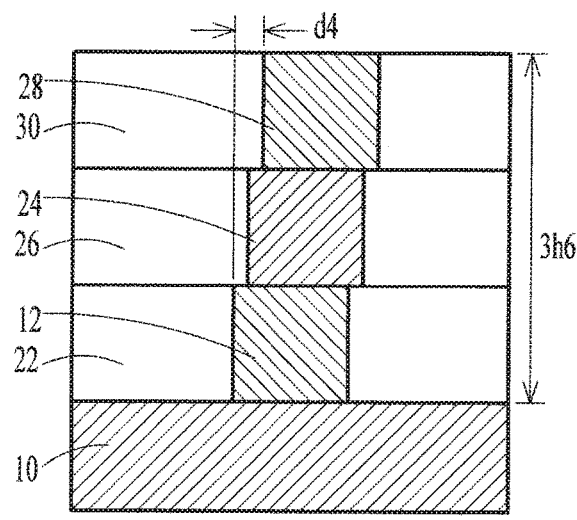

In the process of the present disclosure, we introduce large height tree-like sub 30 nm vias by repeatedly stacking one layer of high angle IBE trimmed vias onto another. Later an MTJ stack is deposited and over etched into the dielectric underneath to simultaneously reduce the conductive metal re-deposition from the MTJ itself and to avoid the conductive metal re-deposition from the bottom electrode. Here a middle angle (30-60°) IBE is used, forming tapered MTJ/dielectric patterns without chemical damage. These tapered patterns with larger bottom critical dimension (CD) than top ensures that the vias underneath are not touched during this step, even if there is an overlay shift while patterning these vias.

In a prior process flow, the MTJ stack is patterned on top of one single layer of IBE trimmed metal via with height <50 nm. The allowed amount of MTJ over etch is not enough to completely remove the metal re-deposition on the tunnel barrier. However, in the process of the present disclosure, by repeatedly stacking one layer of vias onto another and later etching the MTJ by a middle angle IBE, we can greatly over etch the MTJ into the dielectric without touching the vias underneath. In other words, the original via height limit no longer exists. It thus becomes possible to completely eliminate the electrically shorted devices from metal re-deposition.

Referring now to FIGS. 1 through 7, the novel method of the present disclosure will be described in detail. Referring now more particularly to FIG. 1, there is shown a bottom electrode 10 formed on a substrate, not shown. Now, a metal layer 12 for forming a via, such as Ta, TaN, Ti, TiN, W, Cu, Mg, Ru, Cr, Co, Fe, Ni, Pt, Ir, MO, or their combinations such as TiN/Co/Ir, TiN/TiN/Ir, etc. with thickness h1 of 10-100 nm, and preferably ≥50 nm, is deposited onto the bottom electrode 10, which may be made of similar materials. A dielectric hard mask 14 such as $SiO_2$, SiN, SiON, SiC or SiCN with thickness h2 of ≥20 nm is then deposited on the metal layer 12. Photoresist is spin-coated and patterned by 248 nm photolithography, forming patterns 16 with size d1 of ~70-80 nm and height h3 of ≥200 nm.

The dielectric hard mask 14 and metal 12 are etched by RIE using fluorine carbon or chlorine based plasma such as $CF_4$, $CHF_3$, or $Cl_2$ alone, or mixed with Ar and $N_2$. $O_2$ can be added to reduce the pillar size further. They can also be patterned by a physical etch such as IBE. Depending on the thickness of the metal layer 12, the dielectric hard mask 14 can be partially consumed, with a thickness now h4 of ≥15 nm. As shown in FIG. 2, the remaining metal thickness is still h1 (≥50 nm) with pattern size d2 (~50-60 nm).

Next, as illustrated in FIG. 3, with a high angle IBE trimming 20 such as 70-90° with respect to the surface's normal line, the metal pattern decreases to d3, which can range from 10-40 nm, depending on the IBE trimming conditions such as RF power (500-1000 W) and time (100-500 sec). Here, ex-situ IBE trimming is used when the metal vias are made of inert metals and in-situ IBE trimming is needed for metals that can be readily oxidized in air. Due to the protection of the remaining dielectric 14 on top and the extremely low vertical etch rate (≤5 A/sec) of IBE at such a large angle, the remaining via's height h5 is the same as the as-deposited height h1 or decreases less than 5 nm after this step.

Next, referring to FIG. 4, a second dielectric material 22 such as $SiO_2$, SiN, SiON, SiC, or SiCN with thickness ≥50 nm is deposited by physical vapor deposition (PVD), chemical vapor deposition (CVD), or atomic layer deposition (ALD) to encapsulate the vias 12, Here, ex-situ encapsulation is used when the metal vias are made of inert metals and in-situ encapsulation is needed for metals that can be readily oxidized in air. CMP is applied to smooth the surface as well as expose the metal vias underneath, with remaining via height h6 of ≥45 nm.

Next, by repeating these steps, one can build multiple layers of these small size vias onto each other. For example, FIG. 5 illustrates via 24 contacting via 22 and encapsulated by dielectric 26 and via 28 contacting via 24 and encapsulated by dielectric 30. The total height of these vias is dependent on how many layers are stacked, which is determined by the required amount of layer MTJ over etch to completely remove the metal re-deposition. For example, in FIG. 5, the total height of the vias is 3 h6, three times the via height h6 of ≥45 nm. It should be noted that while building multiple layers of vias, there could be an overlay shift d4 ranging from 0-20 nm at random directions, as shown in FIG. 5. The dielectric encapsulation of the stacked vias makes possible the later MTJ over etch without etching the bottom electrode.

Figure 6:
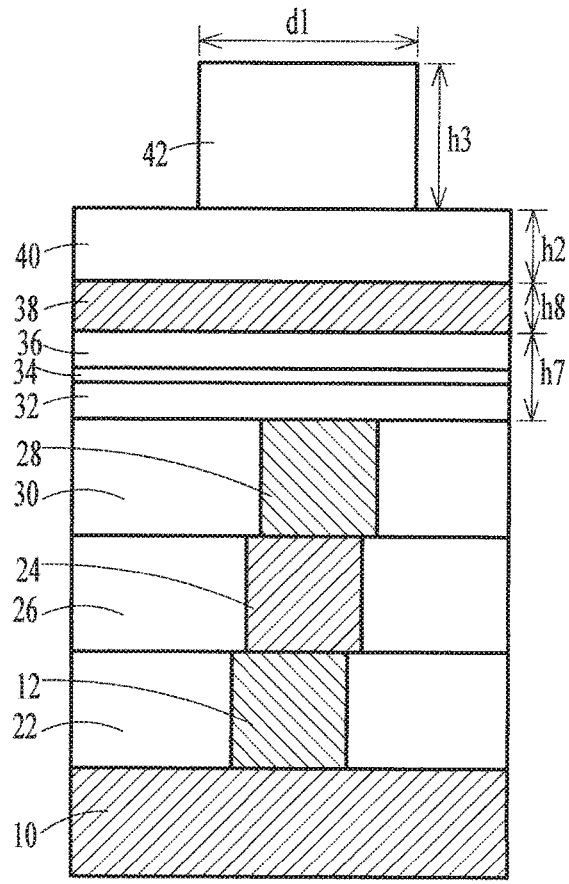

Now, layers are deposited on the encapsulated via stack to form magnetic tunnel junctions, as illustrated in FIG. 6. For example, pinned layer 32, tunnel barrier layer 34, and free layer 36 are deposited. There may be one or more pinned, barrier, and/or free layers. The MTJ layers have a height h7 of 10-30 nm. A top electrode 38 made of similar material to the vias with thickness h8 of 10-100 nm and preferably ≥50 nm is deposited on the MTJ layers. A second dielectric hard mask 40 is deposited on the top electrode 38 with a height ≥20 nm, followed by photoresist coating, exposure, and development to form photoresist patterns 42 with size d1 of ~70-80 nm and height h3 of ≥200 nm.

Figure 7:
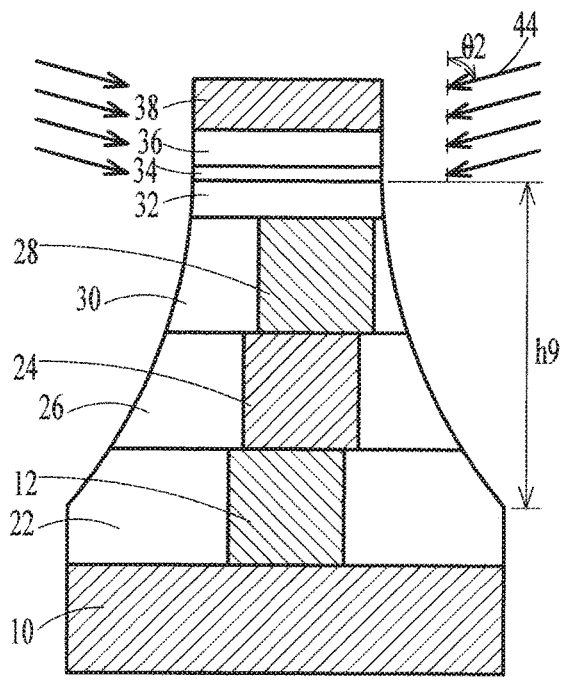

The dielectric hard mask 40 and top electrode 38 are etched by fluorine carbon or chlorine based plasma such as $CF_4$ or $Cl_2$ alone, or mixed with Ar and $N_2$. $O_2$ can be added to further reduce the pillar size. The dielectric hard mask and top electrode can also be etched by pure physical RIE or IBE Now, as shown in FIG. 7, while etching the MTJ stack with a middle angle IBE 44 ranging from 30–60° with a great over etch into the dielectric layers 30/26/22, a tapered MTJ/dielectric profile is formed. One can increase this tapered angle by increasing the IBE etch angle, according to the required total via height and associated overlay shift, thus ensuring that the vias 28/24/12 with shifted overlay underneath are not touched during this step. The effective height of these tree-like vias is greatly enhanced by this method, allowing for a great MTJ over etch to push the re-deposition from the MTJ downward below the tunnel barrier layer 34 so that electrically shorted devices are greatly reduced using this approach.

In the process of the present disclosure, it is demonstrated that by repeatedly stacking one high angle ion beam etching (IBE) trimmed metal via onto another, we can create large height tree-like sub 30 nm vias which are surrounded by dielectric and connect to the bottom electrode below and sub 60 nm MTJ above. The MTJ stack is later etched using IBE, a physical type of etch to avoid chemical damage. During this step, a middle angle is used, resulting in a tapered MTJ profile, i.e., larger bottom CD than top. This ensures that the vias underneath are not touched during the MTJ over etch even though these vias' overlay is shifted during photolithography. This great over etch of the MTJ into the dielectric greatly reduces the conductive materials re-deposition onto the tunnel barrier from the MTJ itself and completely eliminates re-deposition from the bottom electrode, thus reducing the electrically shorted devices.

In summary, the process of the present disclosure allows for a much greater MTJ over etch, offering the potential to completely eliminate the metal re-deposition induced electrically shorted devices. Moreover, it creates these large height sub 30 nm vias using angled IBE, a much lower cost technique, which would otherwise have to involve the complex and expensive immersion 193 nm or EUV photolithograpy. The process of the present disclosure will be used for MRAM chips of the size smaller than 60 nm as problems associated with chemically damaged sidewall and re-deposition from bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method comprising:
   trimming a first metal layer by a first etching process at a first angle with respect to a normal line of a top surface of the first metal layer to form a first conductive via;
   forming a second metal layer on the top surface of the first conductive via;
   trimming the second metal layer by a second etching process at a second angle with respect to a normal line of a top surface of the second metal layer to form a second conductive via;

forming a magnetic tunneling junction (MTJ) stack over the second conductive via, the MTJ stack including a pinned layer, a tunnel barrier layer, and a free layer;
forming a top electrode over the MTJ stack; and
trimming the top electrode and the MTJ stack by a third etching process at a third angle with respect to a normal line of a top surface of the top electrode, the trimming of the top electrode and the MTJ stack occurring without etching the first and second conductive vias.

2. The method of claim 1, wherein the first etching process includes a first ion beam etching process,
wherein the second etching process includes a second ion beam etching process, and
wherein the third etching process includes a third ion beam etching process.

3. The method of claim 1, wherein the first angle is the same as the second angle.

4. The method of claim 1, wherein the third angle is different than the first angle.

5. The method of claim 1, further comprising:
forming a bottom electrode; and
forming the first metal layer directly on the bottom electrode, and
wherein the trimming of the top electrode and the MTJ stack by the third etching process further occurs without etching the bottom electrode.

6. The method of claim 1, further comprising:
forming a first encapsulation layer over the first conductive via;
forming a second encapsulation layer over the second conductive via, and
wherein the trimming of the top electrode and the MTJ stack by the third etching process further includes trimming the first encapsulation layer and the second encapsulation layer.

7. The method of claim 6, wherein the trimmed first encapsulation layer has opposing tapering sidewalls and wherein the trimmed second encapsulation layer has opposing tapering sidewalls.

8. A method comprising:
forming a bottom electrode layer;
forming a first conductive via over and interfacing with the bottom electrode layer, wherein the forming of the first conductive via includes performing a first etching process at a first angle;
forming a second conductive via over the first conductive via, wherein the forming of the second conductive via includes performing a second etching process at a second angle;
forming an encapsulation on the first and second conductive vias;
forming a magnetic tunneling junction (MTJ) stack over the second conductive via, the MTJ stack including a pinned layer, a tunnel barrier layer, and a free layer;
forming a top electrode over the MTJ stack; and
etching the top electrode and the MTJ stack via a third etching process at a third angle, the etching of the top electrode and the MTJ stack occurring without etching the first and second conductive vias and the bottom electrode layer.

9. The method of claim 8, wherein the first angle ranges from about 70° to about 90° with respect to a plane that a top surface of the bottom electrode layer extends along,
wherein the second angle ranges from about 70° to about 90° with respect to the plane that the top surface of the bottom electrode layer extends along, and
wherein the third angle ranges from about 30° to about 60° with respect to the plane that the top surface of the bottom electrode layer extends along.

10. The method of claim 8, further comprising removing a portion of the encapsulation prior to the forming of the MTJ stack over the second conductive via.

11. The method of claim 8, wherein the etching of the top electrode and the MTJ stack via the third etching process at the third angle includes etching the encapsulation layer such that etched encapsulation layer has opposing tapered sidewalls.

12. The method of claim 8, wherein the second conductive via overlaps and is offset from the first conductive via.

13. The method of claim 8, further comprising forming another encapsulation layer on the first conductive via prior to the forming of the second conductive via over the first conductive via.

14. The method of claim 8, further comprising removing a portion of the another encapsulation layer to expose the first conductive via prior to the forming of the second conductive via over the first conductive via.

15. A method comprising:
forming a bottom electrode;
forming a stack of conductive vias on the bottom electrode, wherein the forming of the stack of conductive vias includes performing a first ion beam etching process at a first angle;
forming a magnetic tunneling junction (MTJ) stack over the second conductive via, the MTJ stack including a pinned layer, a tunnel barrier layer, and a free layer;
forming a top electrode over the MTJ stack; and
etching the top electrode and the MTJ stack via a second ion beam etching process at a second angle, the second angle being less than the first angle.

16. The method of claim 15, wherein the stack of conductive vias includes at least three sub 30 nm conductive vias.

17. The method of claim 15, wherein the forming of the stack of conductive vias on the bottom electrode includes:
forming a first metal layer directly on the bottom electrode;
performing the first ion beam etching process at the first angle on the first metal layer to form a first conductive via;
encapsulating the first conductive via with a dielectric layer;
removing a portion of the dielectric layer to expose a top surface of the first conductive via; and
forming a second metal layer directly on the exposed top surface of the first conductive via.

18. The method of claim 17, further comprising patterning the first metal layer prior to the performing of the first ion beam etching process at the first angle on the first metal layer to form the first conductive via.

19. The method of claim 15, wherein the first angle ranges from about 70° to about 90° with respect to a plane that a top surface of the bottom electrode extends along, and
wherein the second angle ranges from about 30° to about 60° with respect to the plane that the top surface of the bottom electrode extends along.

20. The method of claim 15, wherein the etching of the top electrode and the MTJ stack via the second ion beam etching process occurs without etching the stack of conductive vias.

* * * * *